(12) United States Patent
Lilak et al.

(10) Patent No.: US 11,362,189 B2
(45) Date of Patent: Jun. 14, 2022

(54) STACKED SELF-ALIGNED TRANSISTORS WITH SINGLE WORKFUNCTION METAL

(71) Applicant: Intel Corporation, Santa Clara, CA (US)

(72) Inventors: Aaron Lilak, Beaverton, OR (US); Willy Rachmady, Beaverton, OR (US); Rishabh Mehandru, Portland, OR (US); Gilbert Dewey, Beaverton, OR (US); Justin Weber, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 705 days.

(21) Appl. No.: 16/145,123

(22) Filed: Sep. 27, 2018

(65) Prior Publication Data

US 2020/0105891 A1 Apr. 2, 2020

(51) Int. Cl.
| | |
|---|---|
| *H01L 29/423* | (2006.01) |
| *H01L 29/49* | (2006.01) |
| *H01L 29/51* | (2006.01) |
| *H01L 29/66* | (2006.01) |
| *H01L 21/8238* | (2006.01) |
| *H01L 25/065* | (2006.01) |
| *H01L 23/522* | (2006.01) |
| *H01L 27/092* | (2006.01) |
| *H01L 23/00* | (2006.01) |
| *H01L 29/78* | (2006.01) |
| *H01L 27/105* | (2006.01) |

(52) U.S. Cl.
CPC ........... *H01L 29/42372* (2013.01); *H01L 21/823828* (2013.01); *H01L 21/823864* (2013.01); *H01L 21/823871* (2013.01); *H01L 23/5226* (2013.01); *H01L 24/17* (2013.01); *H01L 25/0655* (2013.01); *H01L 27/0924* (2013.01); *H01L 29/4966* (2013.01); *H01L 29/517* (2013.01); *H01L 29/6656* (2013.01); *H01L 29/7851* (2013.01); *H01L 27/105* (2013.01)

(58) Field of Classification Search
None
See application file for complete search history.

(56) References Cited

U.S. PATENT DOCUMENTS

2019/0172828 A1* 6/2019 Smith .............. H01L 27/124

\* cited by examiner

*Primary Examiner* — Hsien Ming Lee
(74) *Attorney, Agent, or Firm* — Schwabe, Williamson & Wyatt P.C.

(57) ABSTRACT

Embodiments include transistor devices and a method of forming the transistor devices. A transistor device includes a first conductive layer over a substrate, a first transistor having first interconnects in the first conductive layer, and a second conductive layer on an insulating layer that is on the first conductive layer. The transistor device also includes a second transistor having second interconnects in the second conductive layer, and a gate electrode over the substrate, where the gate electrode has a workfunction metal that surrounds the first and second interconnects. The first and second conductive layers may include conductive materials such as an epitaxial (EPI) layer, a metal layer, or a doped-semiconductor layer. The transistor device may further include a dielectric surrounding the interconnects as the dielectric is surrounded with the workfunction metal, and a transition layer disposed between the dielectric and interconnects. The dielectric may include a high-k dielectric material.

25 Claims, 9 Drawing Sheets

STACKED SELF-ALIGNED TRANSISTORS WITH SINGLE WORKFUNCTION METAL

FIELD

Embodiments relate to semiconductor structures and processing. More particularly, the embodiments relate to semiconductor structures such as stacked self-aligned transistors that are implemented with a single workfunction metal.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

The drive to scale integrated circuits, such as complementary metal-oxide-semiconductor (CMOS) devices, has recently been obtained through the use of stacked self-aligned transistors. The formation of such transistors typically requires integrating a dual metal gate. In planar technologies, the metals of the metal gate transistors are generally selected to minimize the band offset of a metal for the N-channel MOS (NMOS) transistor with a different metal for the P-channel (PMOS) transistor. Another existing technology involves the stacked transistor architecture which is fabricated from the topside only. In such architecture, the lower metal gate is deposited upon both the upper and lower transistors, and then etched from the topside down to the upper transistors. This process, however, is complex and substantially increases the likelihood of degradation of the upper gate dielectric and channel materials.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1:
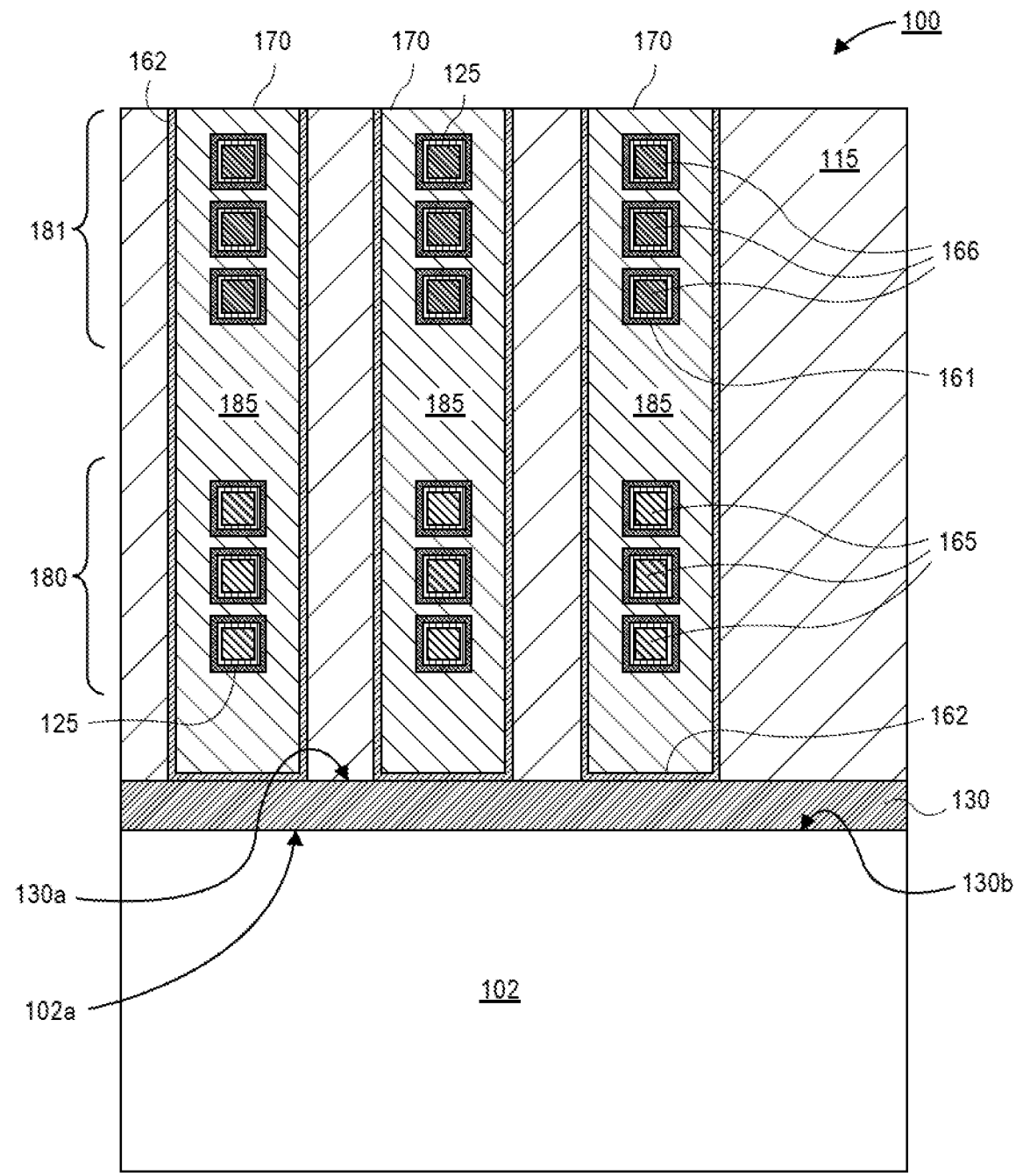
FIG. 1 is an illustration of a cross-sectional view of a transistor device having a plurality of stacked transistors that utilize a single workfunction gate metal, where the cross-sectional view is parallel to the single workfunction gate metal and perpendicular to one or more channels through the middle of the respective gate metal, according to one embodiment.

Embodiments described herein include semiconductor structures such as stacked self-aligned transistors that are implemented with a single workfunction metal. Additionally, the embodiments described herein include a transistor device (e.g., the transistor device 100 of FIG. 1) with a plurality of stacked transistors (e.g., the plurality of stacked transistor 170 of FIG. 1) that utilize a single workfunction gate metal (e.g., the single workfunction gate metal 185 of FIG. 1).

In these embodiments, the transistor device utilizes the single workfunction gate metal (also referred to as a single workfunction gate electrode) with complementary metal-oxide-semiconductor (CMOS) devices to implement a single specified gate metal system, which is used as a mid-gap to such semiconductor devices. As such, in the embodiments described herein, the transistor devices may implement one or more semiconductors and metals to fabricate a stacked self-aligned CMOS transistor with a single workfunction gate metal. As used herein, a "single workfunction gate metal" may refer to a gate electrode of a transistor device, where the gate electrode is formed of a single/common workfunction metal(s) that surrounds the plurality of transistor interconnects/wires (or channels, devices, etc.) of the gate electrode. For example, the single workfunction gate metal may include and surround both of the NMOS and PMOS interconnects (or devices) that are disposed (or embedded) in such gate metal (or gate electrode).

These embodiments therefore enable a stacked CMOS architecture to have a workfunction metal that is common and shared between the N-channel MOS (NMOS) devices and the P-channel (PMOS) devices, and is selected to be the midgap to both NMOS and PMOS devices. Furthermore, the embodiments of the transistor devices described herein improve CMOS processing/packaging solutions by circumventing the various issues/problems (as described above)

involved with removing a deposited gate metal from several portions of a stacked self-aligned transistor system. These embodiments of the transistor devices described herein also improve processing/packaging solutions by (i) eliminating the complex deposition and etch process typically used to form a stacked self-aligned transistor system, and (ii) mitigating any uncertainty related to the degradation of the gate dielectric/channel regions.

In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as integrated circuit design layouts such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

As used herein, the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Likewise, certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to structures and architectures that include stacked self-aligned transistors with a single workfunction metal. In these embodiments, the structures and architectures may utilize the single workfunction gate metal as the mid-gap work function gate metal between the NMOS and PMOS semiconductor devices. As used herein, the terms metal line, interconnect line, trace, wire, conductor, signal path, and signaling medium are all related and often used interchangeably. Furthermore, as used herein, a "metal layer" refers to a conductive layer that may include, but is not limited to, traces, wires, lines, interconnects, planes, and any other conductive formations. In some examples, the metal layer may be any suitable metal such as aluminum (Al), copper (Cu), and/or an alloy of Al and Cu, that are used as conductors to provide signal paths for coupling or interconnecting, electrical circuitry. In addition, the metal layer may include a metal trace (or a metal line/plane/pad) and a via that is coupled to the metal trace, where the via (or contact) may refer to a conductive interconnect/structure used to electrical couple/connect conductors, such as metal traces, from different metal/interconnect levels.

These CMOS devices described herein may be implemented in one or more components associated with an integrated circuit (IC) and/or between various such components. As described herein, the terms chip, integrated circuit (IC), monolithic device, semiconductor device, semiconductor package, and microelectronic device, are often used interchangeably in the semiconductor packaging field, and thus the embodiments described herein may be applicable to all of the above as known in this field. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in, for example, a computer.

Additionally, the embodiments described herein may be implemented further in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including an electronic device implementing one or more transistor devices with a plurality of self-aligned stacked transistors, where a stacked transistor may have a single workfunction gate metal shared between a plurality of semiconductor interconnects/devices/wires (e.g., the semiconductor interconnects 165-166 of FIG. 1) disposed in such transistor.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

FIG. 1 is an illustration of a cross-sectional view of a transistor device 100 having a plurality of stacked transistors 170 that utilize a single workfunction gate metal 185, according to one embodiment. In FIG. 1, the transistor device 100 (or the transistor structure) may be simplified and some components may be omitted in order to not obscure embodiments described herein.

In one embodiment, the transistor device 100 may dispose a first insulating layer 130 on a substrate 102. For example, the first insulating layer 130 may have a top surface 130a that is opposite to a bottom surface 130b, where the bottom surface 130b of the first insulating layer is disposed on a top surface 102a of the substrate 102. In some embodiments, the substrate 102 may be any suitable type of substrate formed using one or more semiconductor materials, which may or may not be combined with silicon, that include but are not limited to germanium, indium antimonide, lead telluride, indium arsenide, indium phosphide, gallium arsenide, indium gallium arsenide, gallium antimonide, and/or other combinations of group III-V, group II-VI, or group IV materials. Although a few examples of materials from which the substrate 102 may be formed are described here, any material that may serve as a foundation (or a foundation layer) upon which a CMOS device (e.g., the stacked transistors 170) may be disposed on may be included (or considered) a substrate.

For other embodiments, the substrate 102 may be a base substrate, a carrier, and/or any well-known semiconductor, insulator, or metallic material. For example, the substrate 102 may be any suitable type of semiconductor substrate, such as a crystalline substrate (e.g., a monocrystalline silicon substrate/carrier), a bulk silicon substrate, a silicon-on-insulator (SOI) substrate, an engineered substrate formed of one or more semiconductor materials (e.g., crystalline silicon, amorphous silicon, polysilicon, etc.), and/or the like. In addition, for some embodiments, the substrate 102 may be full or ground down to a predetermined substrate thickness.

Note that, as used herein, a "substrate" may refer to a portion(s) of semiconducting material such as silicon, germanium, silicon carbide, diamond, gallium arsenide, and gallium nitride. For example, a substrate may be used to refer to a semiconductor chip. The semiconductor chip usually has two parallel surface planes, which are major crystallographic planes. ICs are built in and on the top surface of the semiconductor chip; recently, some IC elements have been disposed perpendicular to the top surface into the bulk of the semiconductor chip. Furthermore, as used herein, a top surface of the semiconductor chip may refer to the top parallel surface of the semiconductor chip—where the semiconductor material comes in contact with other material such as dielectric or conductive materials.

For one embodiment, the first insulating layer 130 may be an oxide layer. In some embodiments, the first insulating layer 130 may include, but is not limited to, silicon dioxide, silicon oxy-nitride, carbon-doped silicon oxide, silicon nitride, carbon-doped silicon nitride or a combination thereof. Additionally, in some embodiments, the first insulating layer 130 may be any dielectric material or insulating material. Note that, for an alternate embodiment, the transistor device 100 may dispose the stacked transistors 170 on/over the substrate 102 without having a first insulating layer disposed on the substrate 102 (or disposed in between the substrate 102).

As shown in FIG. 1, the stacked transistors 170 may include a plurality of first interconnects 165, a plurality of second interconnects 166, and the single workfunction gate metal 185. As used herein, "interconnects" may refer to one or more semiconductor (or CMOS) interconnects including, but are not limited to, semiconductor wires, nanowires (NWs), nanoribbons (NRs), CMOS devices (e.g., NMOS/PMOS devices/channels), and/or the like. In addition, as described below in further detail, the "interconnects" may be formed to have multiple, different shapes (e.g., square, elongated, oval, rectangular, circular, etc.) based on the desired processing/packing application or design.

In some embodiments, the stacked transistors 170 also include a first gate dielectric 161, a second gate dielectric 162, and a transition layer 125. In these embodiments, the stacked transistors 170 implement the single workfunction gate metal 185 (note also referred to as a workfunction (or work function) gate metal/electrode) which surrounds both the first and second interconnects 165-166. As such, the single workfunction gate metal 185 (hereinafter referred to as "the workfunction gate metal) may be formed of one or more metals that surround the first and second interconnects 165-166 (i.e., the first and second interconnects 165-166 utilize and are surrounded by the same/single workfunction metal(s), rather than utilizing and being surrounded by different workfunction metal(s)).

For some embodiments, the transistor device 100 may be implemented as a stacked CMOS structure/architecture, thereby the transistor device 100 disposes (or forms) the stacked transistors 170 on the substrate 102 using, for example, a vertically self-aligned stacking process or the like. Additionally, the transistor device 100 may include a first transistor layer 180 and a second transistor layer 181. Note that the transistor device 100 may include more than two stacked transistor layers, but for simplicity only the first and second transistor layers 180-181 are shown. In one embodiment, the first transistor layer 180 includes the plurality of first interconnects 165, and the second transistor layer 181 respectively includes the plurality of second interconnects 166.

As shown in FIG. 1, the workfunction gate metal 185 is utilized by both the first and second transistor layers 180-181 of each stacked transistor 170, where both transistor layers 180-181 may formed from one or more materials/metals having the same mid-gap work function. Accordingly, the first and second interconnects 165-166 of each stacked transistor 170 may be surrounded by the same workfunction gate metal 185, which is utilized as the midgap to both interconnects 165-166. For example, the transistor device 100 may have a stacked transistor 170, where the second interconnects 166 of the stacked transistor 170 are disposed above the first interconnects 165 of the respective stacked transistor 170 to form a vertically self-aligned stacked transistor 170. Note that the first and second transistor layers 180-181 are not limited to having the same number of interconnects, therefore the transistor layers 180-181 may include a different number of interconnects, according to other embodiments.

In some embodiments, the stacked transistor 170 may implement, but is not limited to, the first transistor layer 180 as a PMOS device, and the second transistor layer 181 as a NMOS device. As such, the second interconnects 166 of the second transistor layer 181 may be NMOS wires (or nanoribbons, devices, etc.) stacked above the first interconnects 165 of the first transistor layer 180 that may be PMOS wires, where both the NMOS and PMOS wires thereby utilize and share the single workfunction gate metal 185. Accordingly, in these embodiments described herein, the workfunction metal(s) of the single workfunction gate metal 185 is common between the first and second transistor layers 180-181 (i.e., between the PMOS and NMOS interconnects) and is selected such that the workfunction metal(s) is midgap to both transistor layers (also referred to as transistor devices, systems, etc.).

In some embodiments, as described above, the first and second interconnects 165-166 may include one or more semiconductor (or CMOS) interconnects, such as semiconductor wires, NWs, NRs, NMOS/PMOS devices/channels, and/or the like. For example, in the illustration of FIG. 1, the first and second interconnects 165-166 are illustrated as square nanowires, however the first and second interconnects 165-166 may be formed to have any desired shape, such as oval wires, rectangular wires, circular/rounded wires, hourglass-shaped wires, elongated wires where the elongation is in the lateral direction (i.e., elongated wires have widths that are greater than the thicknesses (or z-heights)), and so on. In addition, the first and second interconnects 165-166 may be elongated wires that have an elongation in the lateral direction (i.e., the wires are wider than the thickness/depth in the z-direction). For some embodiments, the interconnects 165-166 may have a diameter of approximately 5 to 10 nm. In other embodiments, the interconnects 165-166 may have a diameter of approximately 5 nm or less. In some embodiments, the interconnects 165-166 may have a thickness (or z-height) of approximately 5 to 10 nm, and a length of approximately 15 to 40 nm. In other embodiments, the interconnects 165-166 may have a thickness of approximately 5 nm or less, and a length of approximately 15 nm or less.

As used herein, a transistor may refer to any number of semiconductor (or CMOS) transistors, including, but are not limited to, fin field effect transistor (FinFET) transistors, metal-oxide-semiconductor field-effect transistor (MOSFET) transistors, NW transistors, and/or NR transistors. For example, a transistor device (e.g., the transistor device 100) has a transistor (e.g., the transistor 170) that may be implemented as a four-terminal electronic circuit element. Electrical current can flow in a channel (e.g., one of the interconnects 165-166) between the source terminal and the drain terminal, and the magnitude of the current may be controlled by the voltages at the gate terminal and at the body region. In the transistor, current can flow in both direction of the channel. The transistor also typically includes trenches. In many trench transistors, the gate (e.g., the single workfunction gate 185) is built in the trench, and the body region is shorted internally to the source region. Additionally, as used herein, a source and/or a drain in a transistor may refer to the source and drain terminals, or the two regions in a substrate (or a semiconductor chip) that are connected to the respective terminals. In a vertical transistor, the drain can either be at the top of the substrate surface in a configuration known as source-down, or at the bottom of the substrate surface in a configuration known as drain-down.

As shown in FIG. 1, the stacked transistors 170 may have the single workfunction gate metal 185 formed with the first and second dielectrics 161-162 (or the first and second gate dielectrics). In one embodiment, the second dielectric 162 surrounds the outer edges of the single workfunction gate metal 185, while the first dielectric 161 surrounds the first and second interconnects 165-166 and is surrounded by (or embedded in) the workfunction gate metal 185. In such embodiments, the second dielectric 161 may be formed on the sidewalls as well as on the bottom surfaces of the workfunction gate metals 185, as shown in FIG. 1.

In other embodiments, the stacked transistors 170 may omit the second dielectric 162 and be formed with only the first dielectric 161 that is disposed between the workfunction gate metal 185 and the first and second interconnects 165-166. For example, in these other embodiments, the transistor device 100 may be formed using a selective high-k deposition process (or a similar process) in which case the second dielectric 162 may not be needed (or desired)—based on the processing/packaging design—at the outer edges/sidewalls of workfunction gate metal 185 as shown in FIG. 1.

The first and second dielectrics 161-162 may be any known dielectric or insulating material that may be used to insulate the first and second interconnects 165-166 and the workfunction gate metal 185. In an embodiment, the first and second dielectrics 161-162 may be formed of silicon dioxide ($SiO_2$), silicon oxynitride ($SiOxNy$), a silicon nitride ($Si_3N_4$), and/or any similar dielectrics.

In some embodiments, the first and second dielectrics 161-162 may be a high-k dielectric (or a high-k gate dielectric). In these embodiments, the first and second dielectrics 161-162 may include one or more dielectric materials having a high-k dielectric, such as elements include hafnium, silicon, oxygen, titanium, tantalum, lanthanum, aluminum, zirconium, barium, strontium, yttrium, lead, scandium, niobium, and/or zinc. As used herein, a "high-k dielectric" refers to a material having a higher dielectric constant (k) than silicon oxide, where the terms "oxide," "carbide," "nitride," etc. refer to compounds containing, respectively, oxygen, carbon, nitrogen, etc. Examples of high-k materials that may be used (and/or combined) to form the first and second dielectrics 161-162 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and/or lead zinc niobate.

Furthermore, the transistor device 100 may have the workfunction gate metal 185 disposed inside of the second dielectric 162 and over the outer sidewalls of each of the interconnects 165-166, where one or more layers such as the transition layer 125 and the first dielectric 161 may be disposed between the outer sidewalls of each of the interconnects 165-166 and the workfunction gate metal 185. In additional embodiments, these one or more layers may include additional layers disposed between the first and second interconnects 165-166 and the workfunction gate metal 185, where the additional layers may be used to prevent oxygen diffusion (or the like). For example, the transition layer 125 may be formed between each of the first and second interconnects 165-166 and the first dielectric 161 as a transition layer for a high-k deposition of a high-k dielectric layer (e.g., the first dielectric 161). In one embodiment, the transition layer 125 may be a silicon dioxide or any similar material, where the transition layer 125 may be approximately 1 nm or approximately less than 1 nm.

As shown in FIG. 1, the workfunction gate metal 185 has a pair of laterally opposite sidewalls that surround one or more transistor layers, such as the first and second transistor layer 180-181. The workfunction gate metal 185 may be disposed directly on the second dielectric 162 or the top surface 130a of the first insulating layer 130 over the substrate 102. In the embodiments described herein (and as described below), the same material(s) is used to form the workfunction gate metal 185 for the first transistor layer 180 (or the PMOS transistor/device layer) and the second transistor layer 181 (or the NMOS transistor/device layer). As such, in this manner, the fabrication of CMOS devices (e.g., the transistor device 100) may be greatly simplified as there is no need for the PMOS device (e.g., the first transistor layer 180) to have a gate metal with a different work function than that of the NMOS device (e.g., the second transistor layer 180).

In some embodiments, the single workfunction gate metal 185 (or the same gate electrode structure) may physically couple a PMOS device to an NMOS device, such as physically coupling the first transistor 180 to the second transistor layer 180. As described herein, the workfunction gate metal 185 may be formed of any suitable gate electrode material having the appropriate work function. In some embodiments, the single workfunction gate metal 185 may include one or more workfunction metals such as, but are not limited to, chromium (Cr), molybdenum (Mo), tin (Sn), and silicides such as nickel-silicon (NiSi), titanium (TiSi), and so on. For example, the workfunction metals may be selected based on metals or alloys (or the like) that have chemical properties identified as metals that are not excessively/readily oxidizable. In additional embodiments, the single workfunction gate metal 185 may also include one or more workfunction metals which may utilize titanium/aluminum (Ti/Al) compounds with silicon/silicon-germanium (Si/SiGe) and group III-V (indium-gallium-arsenide (InGaAs) or others) semiconductor metals.

Accordingly, in some embodiments, the first and second transistor layers 180-181 are formed from the same mid-gap work function metal(s) that is not substantially oxidizable (or too readily oxidizable), such as Cr, Mo, Sn, NiSi, TiSi, Ti/AL, Si/SiGe, InGaAs, and/or any combination thereof. It should also be appreciated that the workfunction gate metal 185 need not necessarily be a single material, but rather can also be a composite stack of thin films of one or more materials as described above. In addition, for some embodiments, the workfunction gate metal(s) of the workfunction gate metal 185 may be selected based on the selected materials used to form the respective first and second interconnects 165-166. For example, in some embodiments, the stacked transistor 170 may include multiple metal combinations for the interconnects/wires and workfunction gate metals including, but not limited to, (i) indium-arsenide (InGaAs) NMOS wires and Ge PMOS wires coupled with a Mo workfunction gate metal, (ii) indium-nitrogen (InN) NMOS wires and gallium-antimony (GaSb) PMOS wires coupled with a Cr workfunction gate metal, (iii) indium-antimony (InSb) NMOS wires and tin-oxygen (SnO) PMOS coupled with a Sn workfunction gate metal, and (iv) zinc-oxygen (ZnO) NMOS wires and terbium-titanium-sulfur-oxygen (e.g., $Tb_2Ti_2S_2O_5$) PMOS wires coupled with a silicide workfunction gate metal (e.g., NiSi, TiSi, etc.).

For some embodiments, the transistor device 100 may also include an isolation layer 115 that surrounds the stacked transistors 170. The isolation layer 115 may be implemented as an isolation wall (or barrier) disposed between each of the stacked transistors 170. That is, in one embodiment, the isolation layer 115 may be disposed to separate each of the stacked transistors 170 as shown in FIG. 1. In these embodiments, the isolation layer 115 may include one or more insulating materials and/or may be formed to have one or more compositions (or layers) with liners.

In one embodiment, the isolation layer 115 may be a gate isolation spacer formed between the second dielectrics 162 of adjoining stacked transistors 170, as shown in FIG. 1. The isolation layer 115 may be formed from any material and by any technique suitable to provide a conformal dielectric layer (or isolation layer) between the adjacent sidewalls of the workfunction gate metals 185 of adjacent stacked transistors 170. In one embodiment, the isolation layer 115 may include an insulating layer. In a particular embodiment, the isolation layer 115 may include one or more dielectric/ insulating materials, such as silicon dioxide, silicon oxy-nitride, carbon-doped silicon oxide, silicon nitride, carbon-doped silicon nitride, and/or a combination thereof. As such, in alternate embodiments, the transistor device 100 may omit the isolation layer 115 by disposing, for example, a dielectric material(s) to isolate the stacked transistors 170.

Note that, in other embodiments, one or more of the plurality of stacked transistors 170 may include an insulating layer that may be disposed vertically between the first transistor layer 180 and the second transistor layer 181. In these other embodiments, the workfunction metal(s) of the single workfunction gate metal 185 is still shared/common between both transistor layers 180-181, however the workfunction gate metal 185 is separated by the insulating layer (e.g., the insulating layer may be similar to the first insulating layer 130, and stacked over the first transistor layer 180 and the first insulating layer 130). Likewise, in other embodiments, the one or more of the plurality of stacked transistors 170 may include additional contacts/interconnects (e.g., conductive/metal contacts and wire routing) that may be implemented to couple the first transistor layer 180 to the second transistor layer 181.

Note that the substrate 100 as shown in FIG. 1 may include fewer or additional packaging components and/or materials based on the desired packaging design.

Figure 2A:
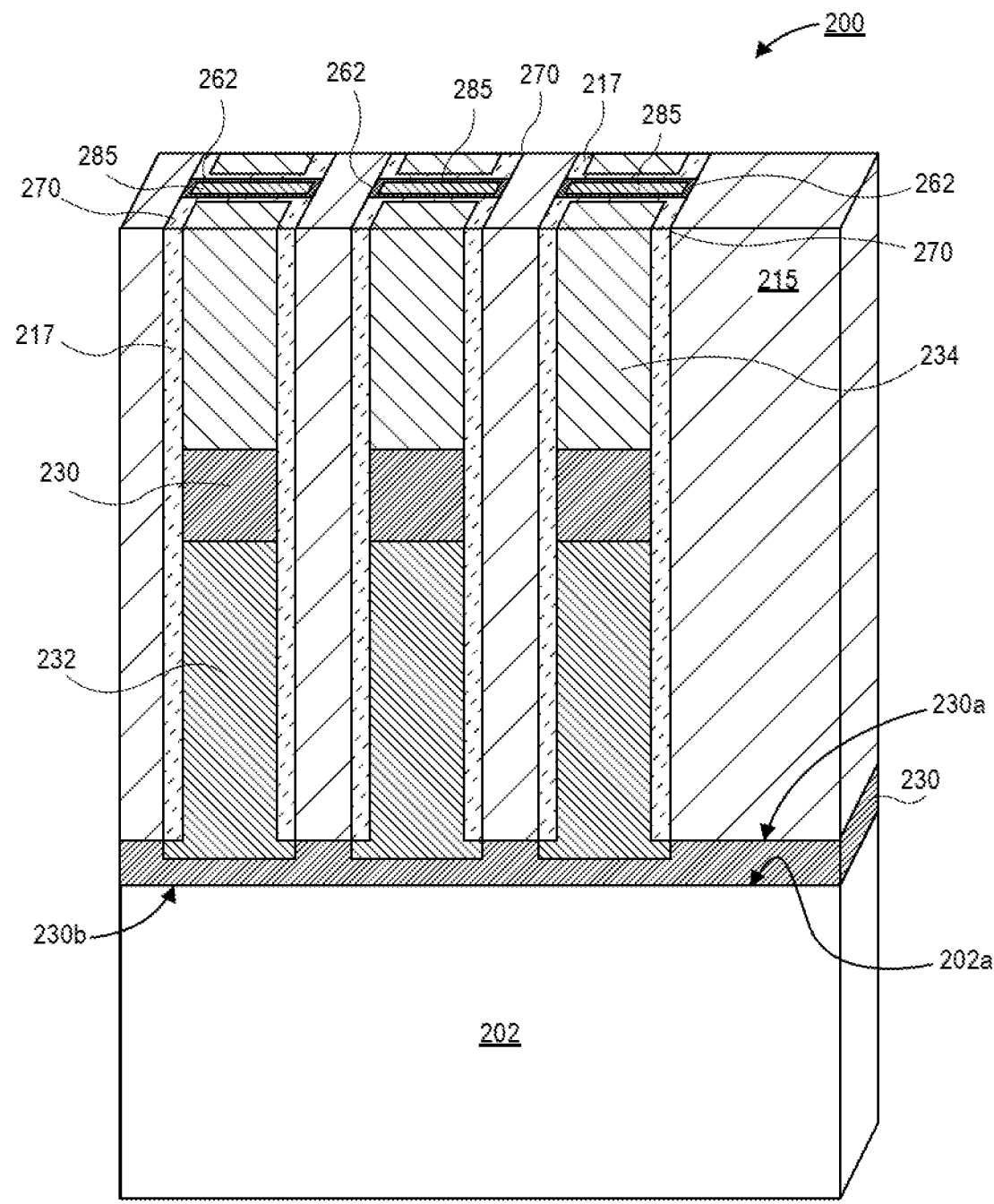
FIG. 2A is a three-dimensional (3D) illustration of a cross-sectional view of a transistor device having a plurality of stacked transistors that utilize a single workfunction gate metal, according to one embodiment.
Figure 2B:
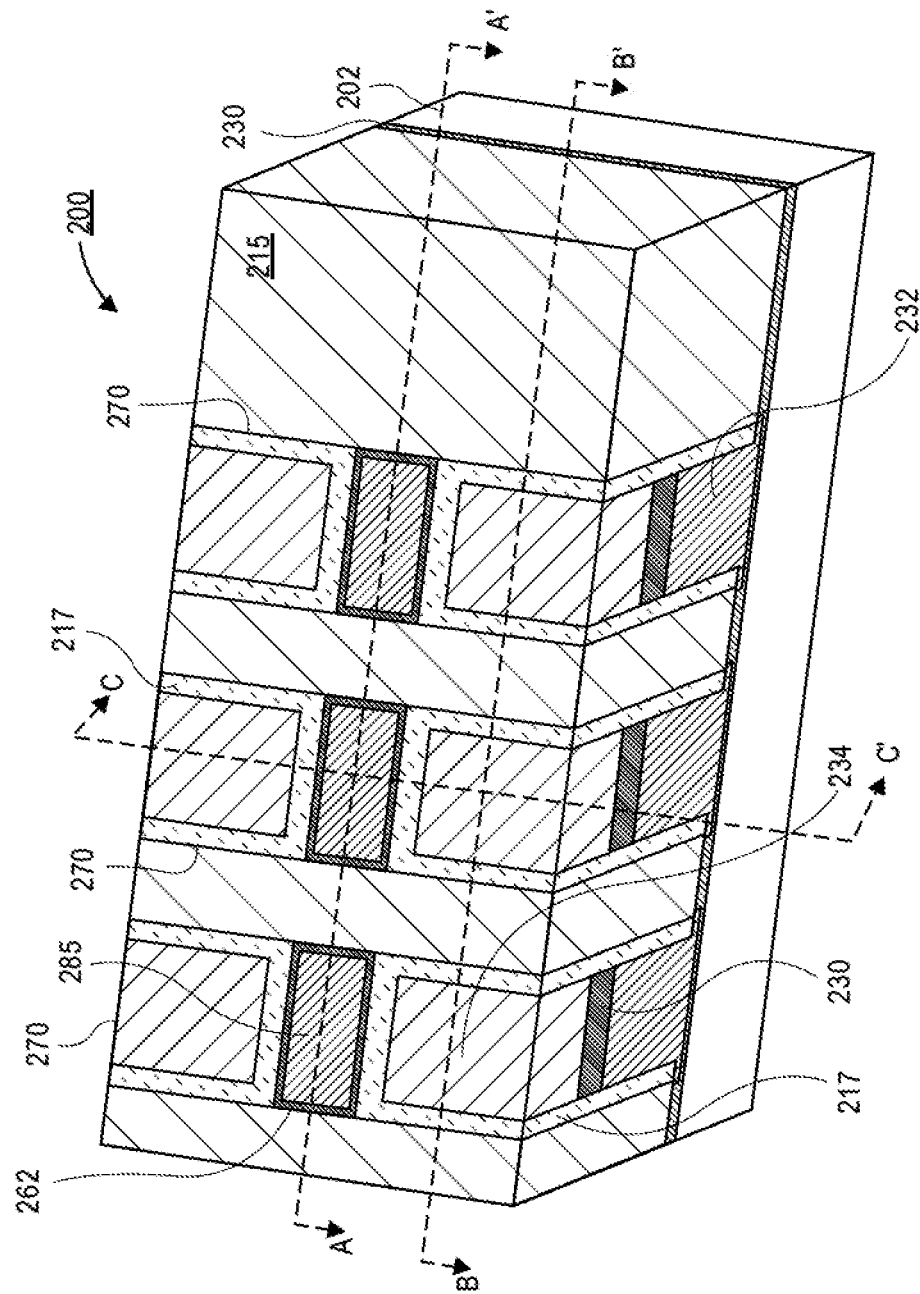
FIG. 2B is a 3D illustration of a perspective view of a transistor device having a plurality of stacked transistors that utilize a single workfunction gate metal, according to one embodiment.
Figure 2C:
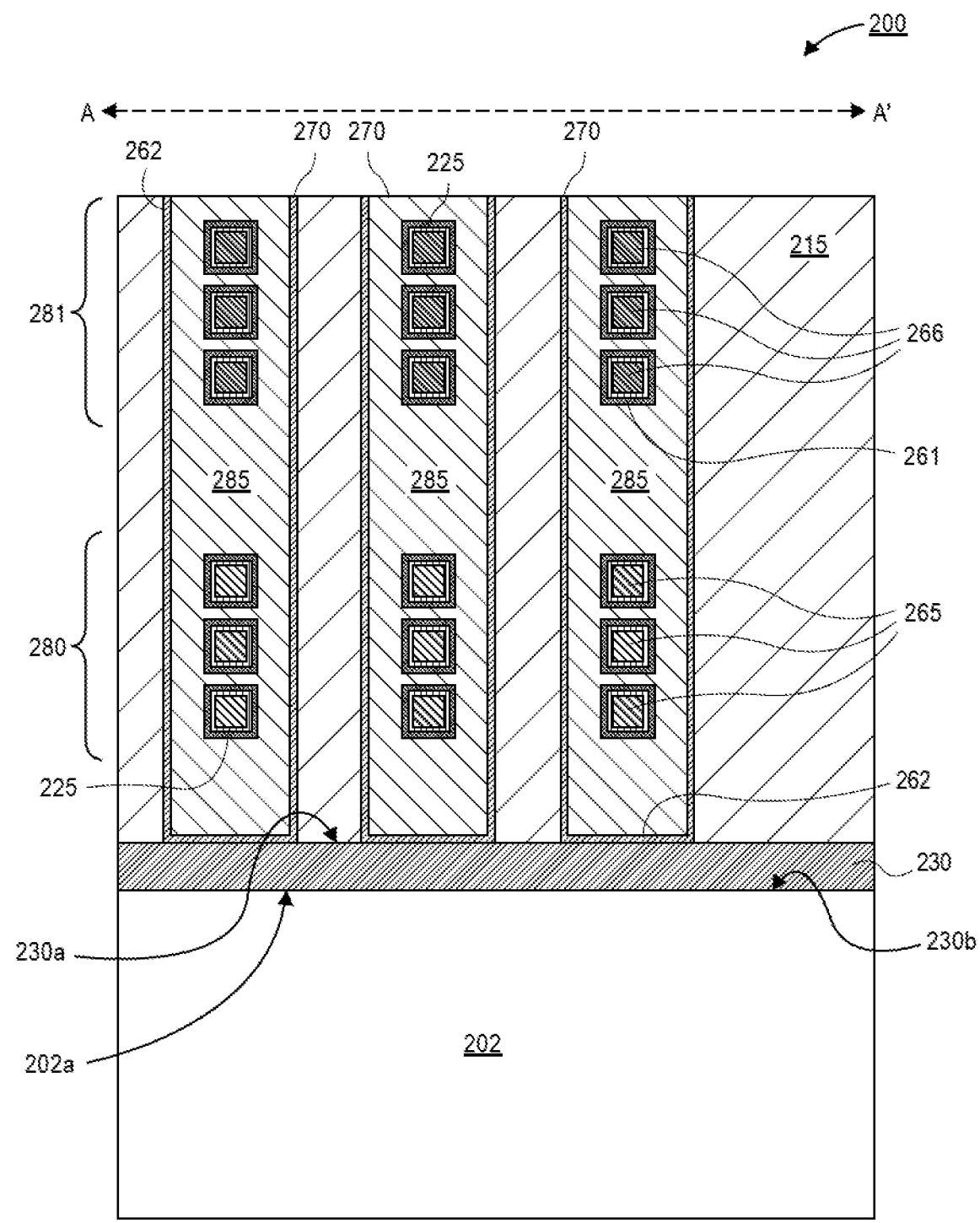
FIG. 2C is an illustration of a cross-sectional view of a transistor device on the A-A' axis and having a plurality of stacked transistors that utilize a single workfunction gate metal, according to one embodiment.
Figure 2D:
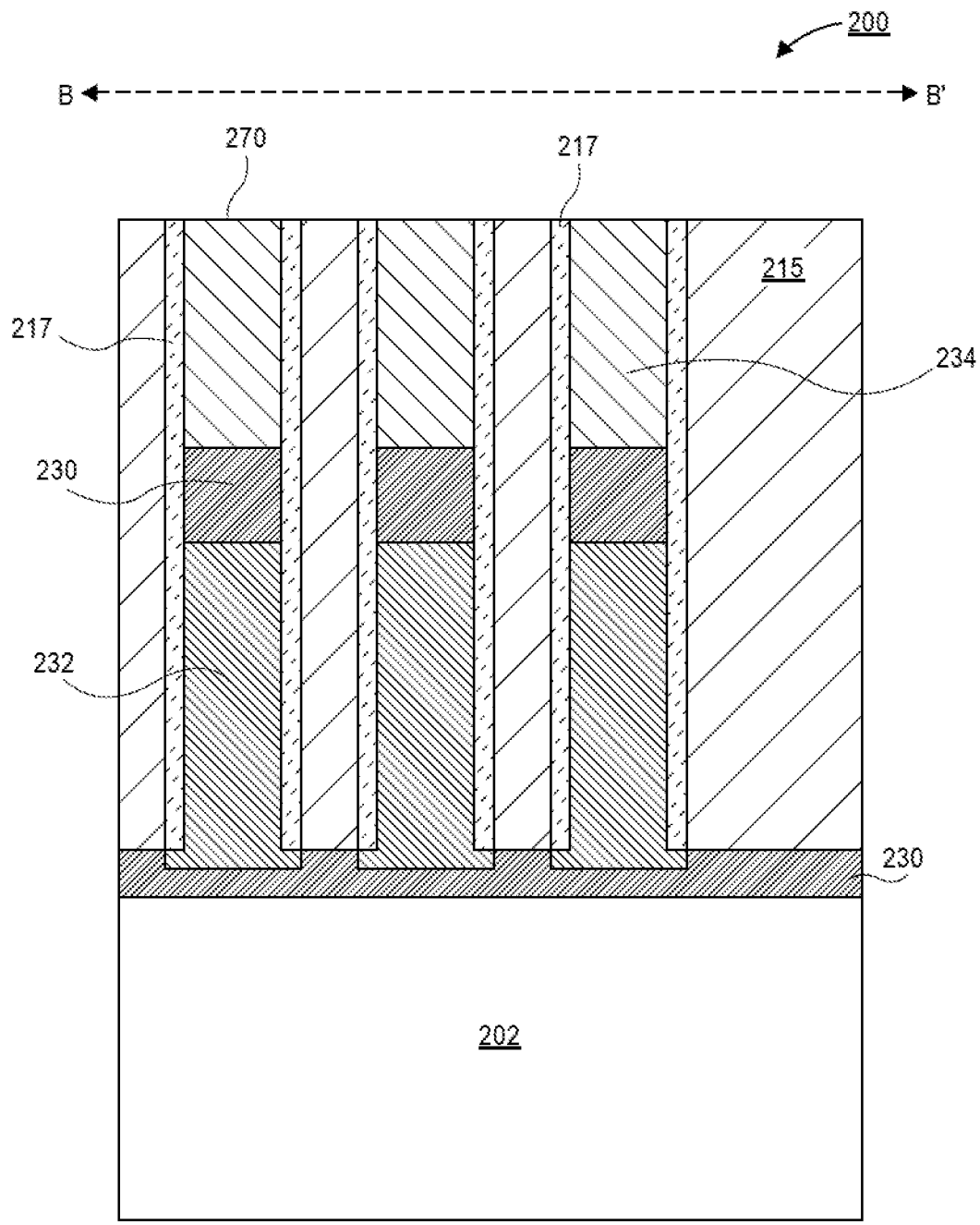
FIG. 2D is an illustration of a cross-sectional view of a transistor device on the B-B' axis and having a plurality of stacked transistors that utilize a single workfunction gate metal, according to one embodiment.
Figure 2E:
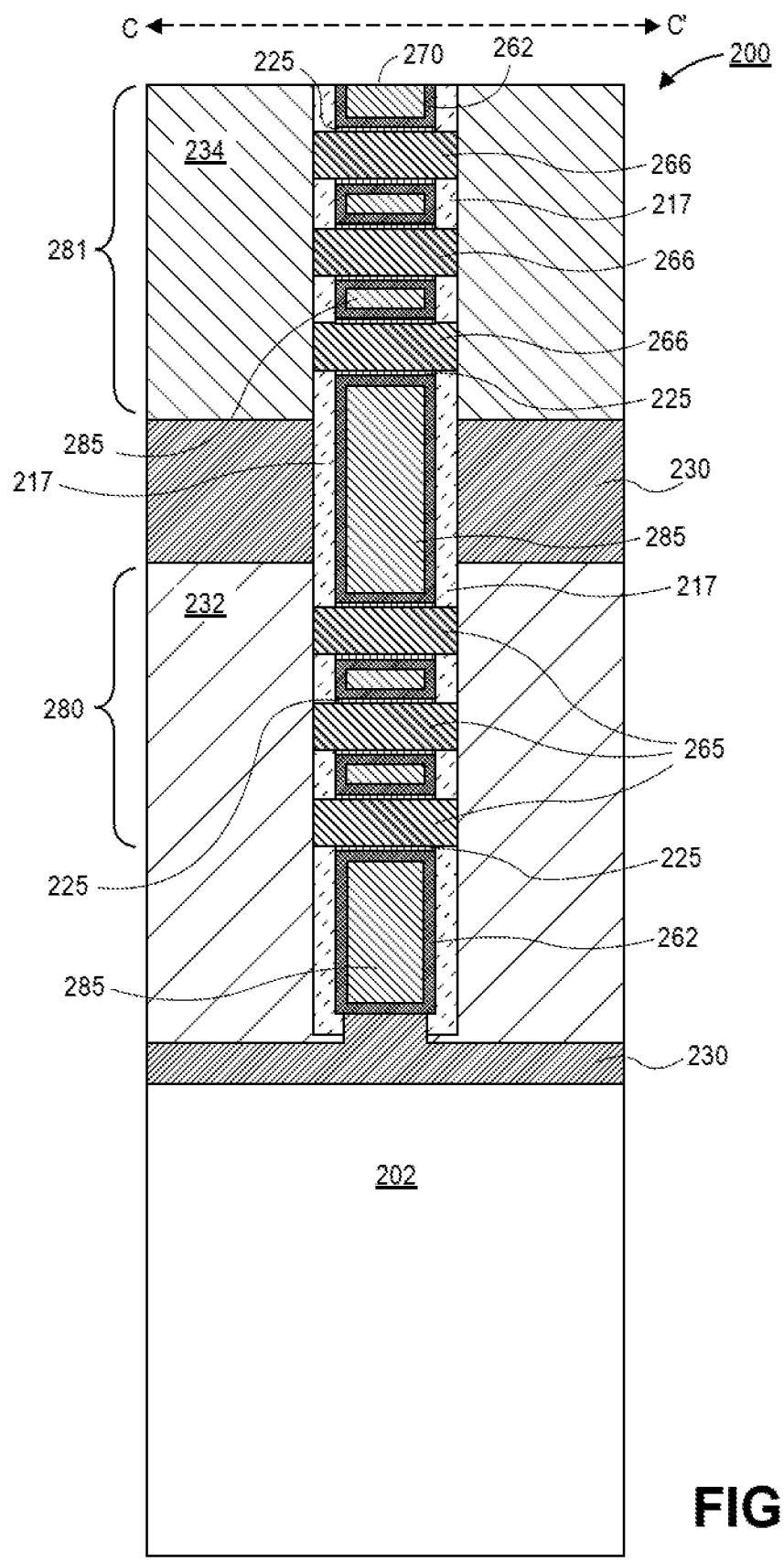
FIG. 2E is an illustration of a cross-sectional view of a transistor device on the C-C' axis and having a plurality of stacked transistors that utilize a single workfunction gate metal, according to one embodiment.

FIGS. 2A-2E are illustrations of cross-sectional views of a transistor device 200 having a plurality of stacked transistors 270 that utilize a single workfunction gate metal 285, according to one embodiment. In particular, these embodiments as shown with respect to FIGS. 2A-2E may provide more detailed illustrations of the transistor device 200, including a top-perspective view as shown in FIG. 2B, a cross-sectional view on the A-A' axis as shown in FIG. 2C, a cross-sectional view on the B-B' axis as shown in FIG. 2D, and a cross-sectional view on the C-C' axis as shown in FIG. 2E. Additionally, in these embodiments as illustrated by FIGS. 2A-2E, a process flow of forming the transistor device 200 may be described based on the detailed views of such device 200. Further note that the transistor device 200 shown in FIGS. 2A-2E may be similar to the transistor device 100 of FIG. 1.

Moreover, the embodiments described herein enable stacked transistor architectures (e.g., the transistor device 200) to utilize a single workfunction gate metal with CMOS devices, such as both NMOS and PMOS devices, to implement a single specified gate metal system, which is used as a mid-gap to such CMOS devices. One such embodiment is illustrated and described based on FIGS. 2A-2E, which illustrates cross-sectional views of the transistor device 200 having a plurality of stacked transistors 270, an isolation layer 215, one or more insulating layers 230, a spacer 217, a first epitaxial (EPI) layer 232, a second EPI layer 234, a single workfunction gate metal 285, first and second dielectrics 261-262, a transitional layer 225, first and second interconnects 265-266, first and transistor layers 280-281, and a substrate 202. In the illustrated embodiments, the build-up layers (e.g., the first and second EPI layers 232 and 234, one or more insulating layers 230, the workfunction gate metal 285, the first and second dielectrics 261-262, the isolation layer 215, etc.) of the transistor device 200 are shown and described (e.g., the patterning and depositing of such build-up layers), however it is to be appreciated that the illustrated features are not limiting and may be formed using different or less processing operations and/or different materials. Note that well-known features of FIGS. 2A-2E are omitted or simplified in order not to obscure the illustrative implementations.

Additionally, in these illustrated embodiments, the interconnects 265-266 is illustrated as having a substantially square cross-section (or a substantially square cross-section). However, it is to be appreciated that the cross-section of the interconnects 265-266 may be any shape, depending on the needs of the device (e.g., a rectangle, an oval, a circle, etc.). It should also be apparent to one skilled in the art that the individual interconnects 265-266 may slightly differ with regard to shape due to processing complexities and non-idealities. Note that the transistor device 200 of FIGS. 2A-2E may be simplified and some components (e.g., conductive pads on channels, conductive interconnects/routing between CMOS devices, etc.) may be omitted in order to not obscure embodiments described herein. Also note that, in the embodiments described herein, the one or more components/layers of the transistor device 200 of FIGS. 2A-2E are similar to the components/layers of the transistor device 100 of FIG. 1.

FIG. 2A is a three-dimensional (3D) illustration of a cross-sectional view of a transistor device 200 having a plurality of stacked transistors 270 that utilize a workfunction gate metal 285, according to one embodiment. In particular, the 3D illustration of FIG. 2A illustrates a portion of the stacked transistor gate-all-around assembly with the single workfunction metal of the transistor device 200.

As shown in FIG. 2A, in some embodiments, the transistor device 200 includes the stacked transistors 270 disposed on a top surface 230a of an insulating layer 230 that is disposed on a top surface 202a of a substrate 202. In this cross-section of the transistor device 200, a sidewall (or edge) of the stacked transistors 270 is shown. In these embodiments, a stacked transistor 270 may include the insulating layer 230 (or a first insulating layer) disposed between the first EPI layer 232 (also referred to as a first conductive layer) and the second EPI layer 234 (also referred to as a second conductive layer), where the first EPI layer 232 may be disposed on the top surface 230a of the insulating layer 230 (or a second insulating layer) that is disposed on the substrate 202. Note that, as shown in FIG. 2A, the insulating layers 230 (or the first and second insulating layers) may be any oxide layer (as described above) and may be formed of the same material. Also note, that in some alternate embodiments, the first EPI layer 232 of the stacked transistor 270 may be disposed directly on the top surface 202a of the substrate 202, where the insulating layer 230 disposed between the first EPI layer 232 and the substrate 202 may be omitted based on the desired processing/packaging design.

In some embodiments, the process flow implemented to form the transistor device 200 may include disposing one or more EPI layer stacks (e.g., the first EPI layer 232, the second EPI layer 234, and so on based on the total number of transistor layers) over the insulating layer 230 and/or the substrate 202. According to some embodiments, the process flow may further include patterning the EPI layer stacks to form the vertically self-aligned stacked transistor layers of the stacked transistors 270 (e.g., the first and second transistor layers 280-281 as shown in FIG. 2C).

In some embodiments, the first and second EPI layers 232 and 234 may be formed of any suitable CMOS materials (e.g., stacked layers of Si/SiGe/Si or the like) that may be used to form one or more CMOS devices (e.g., transistors, memory, etc.). Additionally, for some embodiments, the first and second EPI layers 232 and 234 may be formed of different materials. In other embodiments, the first and second EPI layers 232 and 234 may include one or more layers of a single crystal semiconductor formed on a substrate of, for example, another single crystal semiconductor layer by epitaxial growth. For some embodiments, the first and second EPI layers 232 and 234 may be patterned/disposed to be faceted shape.

In one embodiment, the first EPI layer 232 may have a thickness (or depth) that is approximately equal to a thickness of the second EPI layer 234. For another embodiment, the first EPI layer 232 may have a thickness that is different than a thickness of the second EPI layer 234. Note that, in some alternate embodiments, the first EPI layer 232 may be a first conductive layer, and the second EPI layer 234 may be a second conductive layer, where both the first and second conductive layers of the stacked transistor 270 are formed of one or more metals and/or one or more doped semiconductor layers (i.e., the stacked transistor 270 may utilize the first and second conductive layers 232 and 234, which may be formed of metal/conductive materials or doped semiconductor materials—rather than utilizing EPI materials).

As illustrated in FIG. 2A, the first EPI layer 232 may be a lower EPI layer having source and drain regions, and the second EPI layer 234 may be an upper EPI layer having source and drain regions, according to some embodiments. In one embodiment, one or more source and drain regions may be formed in the first and second EPI layers 232 and 234 on opposite sides of the workfunction gate metal 285.

For example, the source region and the drain region (s/d regions) of the respective EPI layers may be formed of the same conductivity type, such as n-type or p-type conductivity, based on the conductivity type of the respective transistor layer. That is, if the first transistor layer of the stacked transistor is a PMOS device, the s/d regions in the respective EPI layer are formed of p-type materials; and if the second transistor layer of the stacked transistor is a NMOS device, the s/d regions in the respective EPI layer are formed of n-type materials.

As shown with the top-view of the 3D illustration of FIG. 2A, the stacked transistor 270 has one or more channel regions formed of PMOS/NMOS interconnects (or devices) (e.g., the first and second interconnects 265-266 of FIG. 2C), where the channel regions are the portions of the interconnects located between the source regions and drain regions, and are disposed in the workfunction gate metals 285 and the gate dielectrics (e.g., the first dielectric 261 of FIG. 2C). In addition, as shown with the top-view, the stacked transistor 270 may dispose a second dielectric 262 to surround the outer sidewalls/edges of the workfunction gate metal 285. Note that, as shown in FIG. 2A, the stacked transistors 270 have the s/d regions of the first and second EPI layers 232 and 234 electrically isolated vertically. However, in alternate embodiments, one or more of the s/d regions of the first and second EPI layers 232 and 234 may be electrically coupled using, for example, a conductive routing layer (or a metal filling) in the source/drain regions, or a conductive layer from one EPI layer to another EPI layer. Also note that the stacked transistors 270 of the transistor device 200 may include metal contacts coupled to the source/drain regions—but are omitted to simplify the illustrations.

In some embodiments, a pair of sidewall spacers 217 may be formed on opposing sides of the stacked layers (i.e., the insulating and EPI stacked layers) disposed within the stacked transistor 270 to form portions of the outer sidewalls/edges of the stacked transistor 270. The sidewall spacers 217 may be formed from a material such as silicon nitride, silicon oxide, silicon carbide, silicon nitride doped with carbon, and silicon oxynitride. The sidewall spacers 217 may be formed using any known deposition and etching process.

As shown in FIG. 2A, the sidewall spacers 217 may not surround one or more outer portions of the first EPI layers 232, including at the lower corners of the stacked transistors 270 where the first EPI layers 232 may be coupled to the isolation layer 215. However, in alternate embodiments, the sidewalls spacers 217 may be disposed to entirely/fully insulate the first and second EPI layers 232 and 234, including at the lower corners of the stacked transistors 270 where the sidewall spacers 217 may fully insulate the first EPI layer 232 from the isolation layer 215. Note that, as described above, the transistor device 200 may pattern and dispose a dielectric (or the like) to form a dielectric wall between each of the stacked transistors 270, rather than using the isolation layer 215 as an isolation wall between each of the stacked transistors 270.

Note that the transistor device 200 as shown in FIG. 2A may include fewer or additional packaging components and/or materials based on the desired packaging design.

FIG. 2B is the 3D illustration of a top-perspective view of the transistor device 200 having the stacked transistors 270 that utilize the same/single workfunction gate metal 285, according to one embodiment. In particular, FIG. 2B illustrates the transistor device 200 with three different cross-sections on the A-A' axis, the B-B' axis, and the C-C' axis as shown below in FIGS. 2C-2E, respectively.

As shown in FIG. 2B, each of the stacked transistors 270 of the transistor device 200 may have the workfunction gate metal 285 surround by the second dielectric 262, and disposed/sandwiched between the sidewall spacers 217, the insulating layer 230, the first and second EPI layers 232 and 234, and the isolation layer 215. In some embodiments, as described above, the second dielectric 262 may be a high-k dielectric layer that is disposed on the sidewalls/edges of the workfunction gate metal 285. However, in alternate embodiments, the transistor device 200 may implement a selective high-k deposition in which case the dielectrics may be selectively disposed on the workfunction gate metal 285, as such the second dielectric 262 may be selectively omitted (or omitted from this top-perspective view).

Note that the transistor device 200 as shown in FIG. 2B may include fewer or additional packaging components and/or materials based on the desired packaging design, such as the number of interconnect layers and the number of stacked transistor pairs which may vary based on the desired packaging design.

FIG. 2C is an illustration of a cross-sectional view of the transistor device 200 on an A-A' axis and having the stacked transistors 270 that utilize the single workfunction gate metal 285, according to one embodiment. As described above, the transistor device 200 of FIG. 2C is similar the transistor device 100 of FIG. 1.

In one embodiment, the transistor device 200 may dispose the insulating layer 230 on the substrate 202. For example, the insulating layer 230 may have the top surface 230a that is opposite to the bottom surface 230b, where the bottom surface 230b of the insulating layer is disposed on the top surface 202a of the substrate 202. As shown in FIG. 2C, the stacked transistors 270 may include the plurality of first interconnects 265, the plurality of second interconnects 266, and the single workfunction gate metal 285. In some embodiments, the stacked transistors 270 also include the first gate dielectric 261, the second gate dielectric 262, and the transition layer 225. In these embodiments, the stacked transistors 270 may implement the workfunction gate metal 285 which surrounds both the first and second interconnects 265-266. As such, the workfunction gate metal 285 may be formed of one or more common/shared metals that surround both the first and second interconnects 265-266 (i.e., the first and second interconnects 265-266 utilize and are surrounded by the same/single workfunction metal(s), rather than utilizing and being surrounded by different workfunction metal (s)).

For some embodiments, the transistor device 200 may include the first transistor layer 280 (e.g., the PMOS transistor layer) and the second transistor layer 281 (e.g., the NMOS transistor layer). In other embodiments, the transistor device 200 may include more than two stacked transistor layers, but for simplicity only the first and second transistor layers 280-281 are shown. In one embodiment, the first transistor layer 280 includes the plurality of first interconnects 265 (e.g., the PMOS devices), and the second transistor layer 281 respectively includes the plurality of second interconnects 266 (e.g., the NMOS transistor devices).

As shown in FIG. 2C, the workfunction gate metal 285 is utilized by both the first and second transistor layers 280-281 of each stacked transistor 270, where both transistor layers 280-281 may formed from one or more materials/metals having the same mid-gap work function. Accordingly, the first and second interconnects 265-266 of each stacked transistor 270 may be surrounded by the same workfunction gate metal 285 as the midgap to both interconnects 265-266. The stacked transistors 270 may have the workfunction gate metal 285 formed with the first and second dielectrics 261-262 (or the first and second gate dielectrics). In one embodiment, the second dielectric 262 surrounds the outer edges of the workfunction gate metal 285, while the first dielectric 261 surrounds the first and second interconnects 265-266 and is surrounded by (or embedded in) the workfunction gate metal 285. In such embodiments, the second dielectric 261 may be formed on the sidewalls as well as on the bottom surfaces of the workfunction gate metals 285, as shown in FIG. 2C.

As described above, the workfunction gate metal 285 may be formed of any suitable gate electrode material(s) having the appropriate work function. In some embodiments, the workfunction gate metal 285 may include one or more workfunction metals such as, but are not limited to, Cr, Mo, Sn, and silicides such as NiSi, TiSi, and so on. For example, the workfunction metals may be selected based on metals or alloys (or the like) that have chemical properties identified as metals that are not excessively/readily oxidizable. In additional embodiments, the workfunction gate metal 285 may also include one or more workfunction metals which may utilize Ti/Al compounds with Si/SiGe and group III-V semiconductor metals (e.g., InGaAs or the other like metals). Additionally, the isolation layer 215 may be disposed between each of the stacked transistors 270 of the transistor device 200. Meanwhile, as described above, a dielectric wall may be disposed between each of the stacked transistors 270, according to alternate embodiments.

Note that the transistor device 200 as shown in FIG. 2C may include fewer or additional packaging components and/or materials based on the desired packaging design.

FIG. 2D is an illustration of a cross-sectional view of a transistor device on a B-B' axis and having a plurality of stacked transistors that utilize a single workfunction gate metal, according to one embodiment. In particular, FIG. 2D illustrates the two-dimensional (2D) cross-sectional view of the transistor device 200 shown by the 3D view of FIG. 2A.

As shown in FIG. 2D, in some embodiments, the transistor device 200 includes the stacked transistors 270 disposed on the insulating layer 230 (or the first insulating layer) that is disposed on the substrate 202. In these embodiments, the stacked transistor 270 may include the insulating layer 230 (or the second insulating layer) disposed between the first EPI layer 232 and the second EPI layer 234, where the first EPI layer 232 may be disposed on the insulating layer 230 that is disposed on the substrate 202. In some embodiments, transistor device 200 may include the sidewall spacers 217 to encapsulate the first and second EPI layers 232 and 234 and the insulating layer 230 of the stacked transistor 270. Likewise, the transistor device 200 may also include the isolation layer 215 disposed between the stacked transistors 270, where the isolation layer 215 may be formed between adjacent sidewall spacers 217 that are disposed on two adjacent outer sidewalls of two stacked transistors 270 (as shown in FIG. 2D).

Note that the substrate 200 as shown in FIG. 2D may include fewer or additional packaging components and/or materials based on the desired packaging design.

FIG. 2E is an illustration of a cross-sectional view of the transistor device 200 on a C-C' axis and having the stacked transistors 270 utilizing the workfunction gate metal 185, according to one embodiment. In particular, as shown in FIG. 2B, FIG. 2E illustrates the perpendicular cross-sectional view of the transistor device 200 across one of the stacked transistors 270.

As shown in FIG. 2E, in some embodiments, the transistor device 200 includes one of the stacked transistors 270 disposed on the insulating layer 230 (or the first insulating layer) that is disposed on the substrate 202. In these embodiments, the stacked transistor 270 may include the insulating layer 230 (or the second insulating layer) disposed between the first EPI layer 232 and the second EPI layer 234, where the first EPI layer 232 may be disposed on the insulating layer 230 that is disposed on the substrate 202. In some embodiments, transistor device 200 may include the sidewall spacers 217 to surround (either partially or entirely) the first and second EPI layers 232 and 234, the second dielectric 262, the transition layer 225, and the workfunction gate metal 285 of the stacked transistor 270.

In addition, as illustrated in FIG. 2E, the stacked transistor 270 may have the first and second interconnects 265-266 disposed between the sidewall spacers 217, where the first interconnects 265 are utilized by the first transistor layer 280, and respectively the second interconnects 266 are utilized by the second transistor layer 281. For example, in some embodiments, the stacked transistor 270 may employ the left and right regions of the first EPI layer 232 as the source/drain regions of the first transistor layer 280 (e.g., the PMOS transistor device) that are disposed between the workfunction gate metal 285 (or the workfunction gate electrode) of the first transistor layer 280.

Note that the substrate 200 as shown in FIG. 2D may include fewer or additional packaging components and/or materials based on the desired packaging design.

Figure 3B:
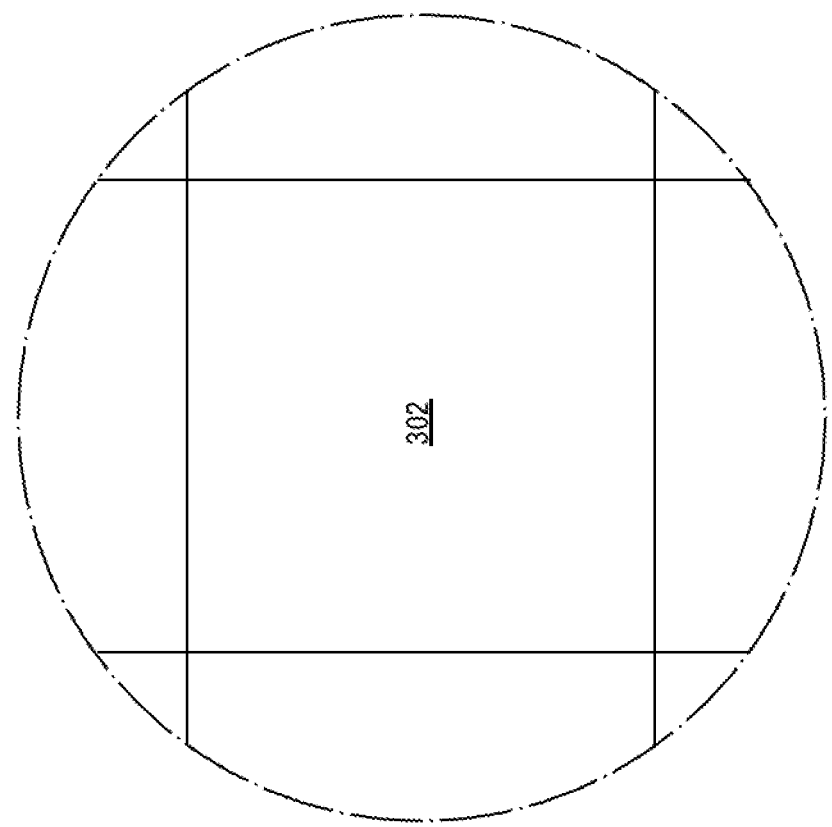
FIGS. 3A and 3B are illustrations of top views of an electronic device having a wafer and dies that include one or more transistor devices with a plurality of stacked transistors that utilize a single workfunction gate metal, according to some embodiments.
Figure 3A:
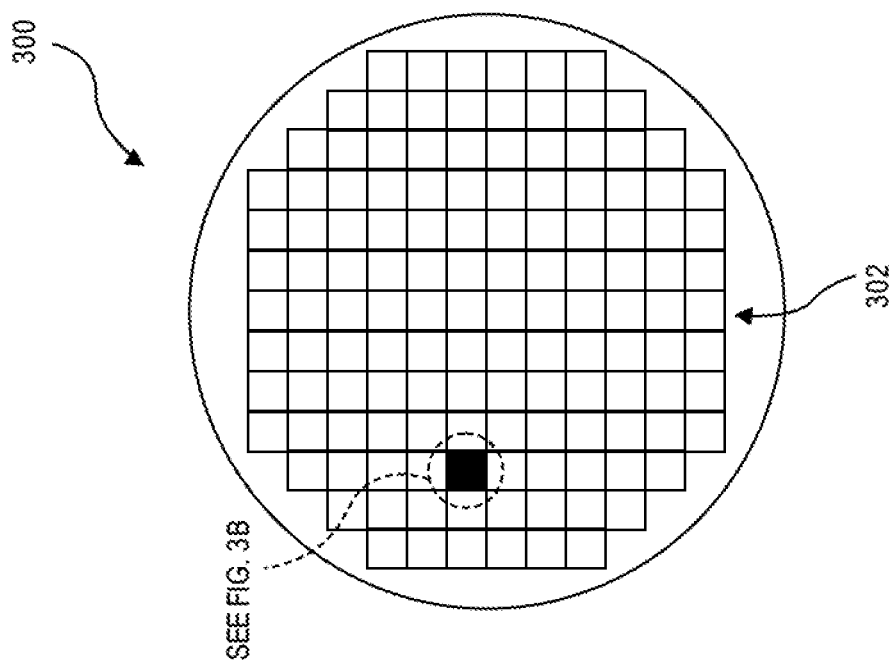

Referring now to FIGS. 3A-3B. The integrated circuit structures described herein may be included in an electronic device. As an example of one such apparatus, FIGS. 3A and 3B are top views of a wafer and dies that include one or more transistor devices with a plurality of stacked transistors that utilize a single workfunction gate metal, in accordance with one or more of the embodiments described herein.

As illustrated in FIGS. 3A-3B, a wafer 300 may be composed of semiconductor material and may include one or more dies 302 having IC structures formed on a surface of the wafer 300. Each of the dies 302 may be a repeating unit of a semiconductor product that includes any suitable IC (e.g., ICs with one or more transistor devices having a plurality of stacked transistors that utilize a single workfunction gate metal as described above). After the fabrication of the semiconductor product is complete, the wafer 300 may undergo a singulation process in which each of the dies 302 is separated from one another to provide discrete "chips" of the semiconductor product. In particular, structures that include embedded non-volatile memory structures having an independently scaled selector as described herein may take the form of the wafer 300 (e.g., not singulated) or the form of the die 302 (e.g., singulated). The die 302 may include one or more embedded non-volatile memory structures based independently scaled selectors and/or supporting circuitry to route electrical signals, as well as any other IC components. In some embodiments, the wafer 300 or the die 302 may include an additional memory device (e.g., SRAM device), a logic device (e.g., an AND, OR, NAND, or NOR gate), or any other suitable circuit element. Multiple ones of these devices may be combined on a single die 302. For example, a memory array formed by multiple memory devices may be formed on a same die 302 as a processing device or other logic that is configured to store information in the memory devices or execute instructions stored in the memory array.

Embodiments described herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches described herein.

Note that the wafer 300 and/or the die 302 of FIGS. 3A-3B may include fewer or additional components and/or materials based on the desired packaging design.

Figure 4:
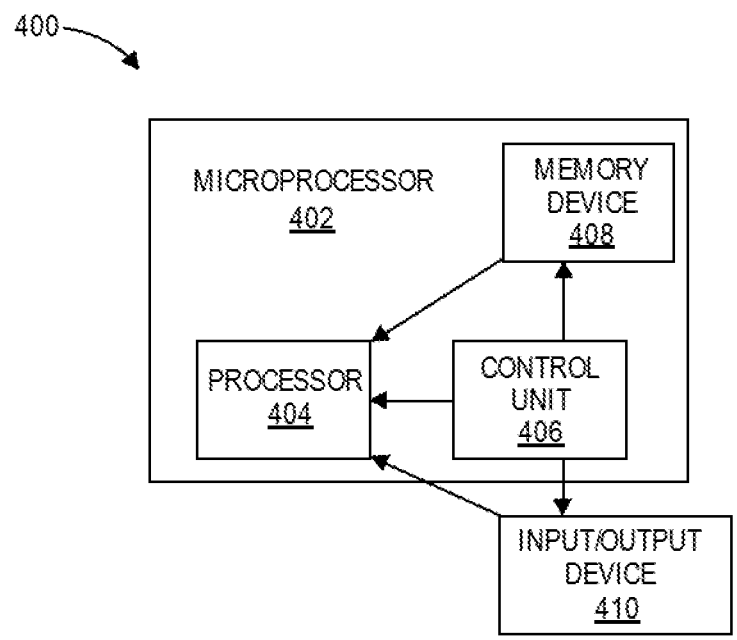
FIG. 4 is a schematic block diagram illustrating an electronic system that utilizes an input/output (I/O) device and a semiconductor package, which includes a processor, a memory device, and a control unit, according to one embodiment.

FIG. 4 is a schematic block diagram illustrating an electronic system 400 that utilizes an I/O device 410 and a microprocessor 402, which includes a processor 404, a memory device 408, and a control unit 406, according to one embodiment. FIG. 4 is an illustration of an electronic system 400, according to one embodiment. The electronic system 400 can correspond to, for example, a portable system, a computer system, a process control system, or any other system that utilizes a processor and an associated memory. The electronic system 400 may include the microprocessor 402, the processor 404, the control unit 406, the memory device 408, and the I/O device 410. Note that it is to be appreciated that the electronic system 400 may have a plurality of processors, control units, memory device units, and/or I/O devices in various embodiments. In one embodiment, the electronic system 400 has a set of instructions that define operations which are to be performed on data by the processor 404, as well as, other transactions between the processor 404, the memory device 408, and the I/O device 410. The control unit 406 coordinates the operations of the processor 404, the memory device 408 and the I/O device 410 by cycling through a set of operations that cause instructions to be retrieved from the memory device 408 and executed. The memory device 408 can include a transistor device as described above (e.g., the transistor devices 100 and 200 of FIGS. 1 and 2A-2E). In an embodiment, the memory device 408 is embedded in the microprocessor 402, as illustrated in FIG. 4. In another embodiment, the processor 404, or another component of the electronic system 400, may include one or more transistor devices with a plurality of stacked transistors that utilize a single workfunction gate metal, such as those described herein.

Note that the electronic system 400 of FIG. 4 may include fewer or additional packaging components and/or materials based on the desired packaging design.

Figure 5:
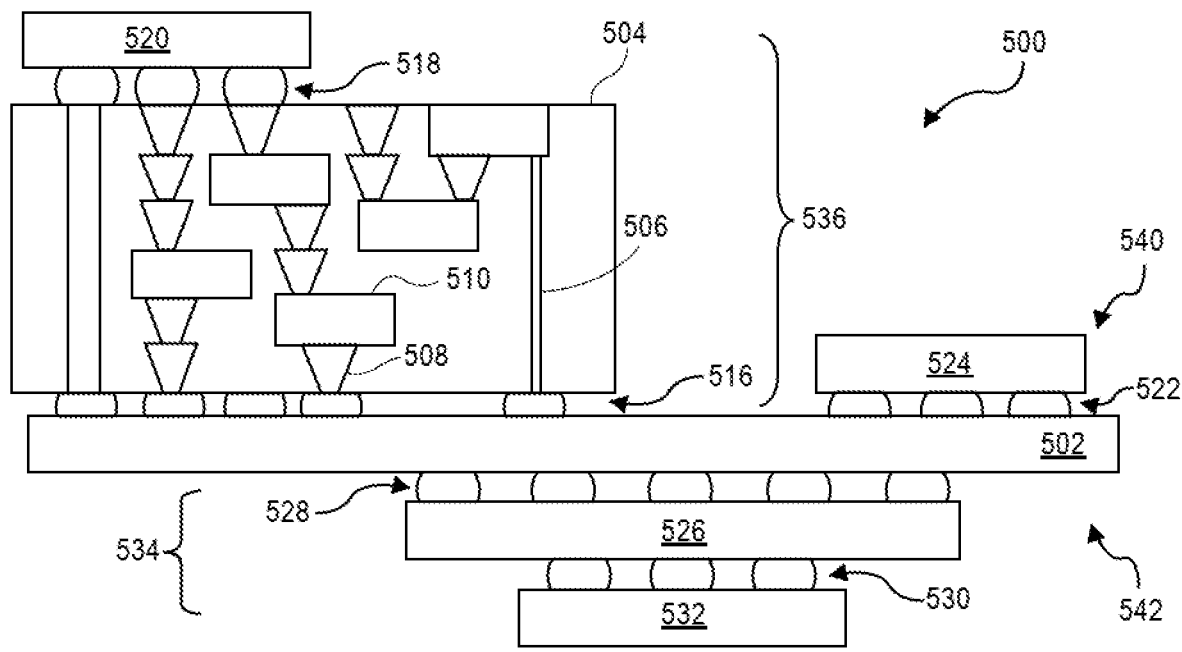
FIG. 5 is a cross-sectional view of an integrated circuit (IC) device assembly that includes one or more transistor devices with a plurality of stacked transistors that utilize a single workfunction gate metal, according to one embodiment.

FIG. 5 is a cross-sectional side view of an IC device assembly which may include one or more transistor devices with a plurality of stacked transistors that utilize a single workfunction gate metal, in accordance with one or more of the embodiments described herein. As illustrated in FIG. 5, an IC device assembly 500 includes components having one or more IC structures as described herein. The IC device assembly 500 includes a number of components disposed on a circuit board 502 (e.g., a motherboard). The IC device assembly 500 includes components disposed on a first face 540 of the circuit board 502 and an opposing second face 542 of the circuit board 502. Generally, components may be disposed on one or both faces 540 and 542. In particular, any suitable ones of the components of the IC device assembly 500 may include a number of CMOS structures, such as the transistors devices described herein with one or more stacked transistors that utilize a single workfunction gate metal (e.g., the workfunction gate metal 185 of FIG. 1).

In some embodiments, the circuit board 502 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 502. In other embodiments, the circuit board 502 may be a non-PCB substrate.

The IC device assembly 500 illustrated in FIG. 5 includes a package-on-interposer structure 536 coupled to the first face 540 of the circuit board 502 by coupling components 516. The coupling components 516 may electrically and mechanically couple the package-on-interposer structure 536 to the circuit board 502, and may include solder balls (as shown in FIG. 5), male and female portions of a socket, an adhesive, an underfill material, and/or any other suitable electrical and/or mechanical coupling structure.

The package-on-interposer structure 536 may include an IC package 520 coupled to an interposer 504 by coupling components 518. The coupling components 518 may take any suitable form for the application, such as the forms discussed above with reference to the coupling components 516. Although a single IC package 520 is shown in FIG. 5, multiple IC packages may be coupled to the interposer 504. Note that it is to be appreciated that additional interposers may be coupled to the interposer 504. The interposer 504 may provide an intervening substrate used to bridge the circuit board 502 and the IC package 520. The IC package 520 may be or include, for example, a die (e.g., the die 302 of FIG. 3B), or any other suitable component. Generally, the interposer 504 may spread a connection to a wider pitch or reroute a connection to a different connection. For example, the interposer 504 may couple the IC package 520 (e.g., a die) to a ball grid array (BGA) of the coupling components 516 for coupling to the circuit board 502. In the embodiments illustrated in FIG. 5, the IC package 520 and the circuit board 502 are attached to opposing sides of the interposer 504. In other embodiments, the IC package 520 and the circuit board 502 may be attached to a same side of the interposer 504. In some embodiments, three or more components may be interconnected by way of the interposer 504.

The interposer 504 may be formed of an epoxy resin, a fiberglass-reinforced epoxy resin, a ceramic material, or a polymer material such as polyimide. In some implementations, the interposer 504 may be formed of alternate rigid or flexible materials that may include the same materials described above for use in a semiconductor substrate, such as silicon, germanium, and other group III-V and group IV materials. The interposer 504 may include metal interconnects 510 and vias 508, including but not limited to through-silicon vias (TSVs) 506. The interposer 504 may further include embedded devices 514, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 504. The package-on-interposer structure 536 may take the form of any of the package-on-interposer structures known in the art.

The IC device assembly 500 may include an IC package 524 coupled to the first face 540 of the circuit board 502 by coupling components 522. The coupling components 522 may take the form of any of the embodiments discussed above with reference to the coupling components 516, and the IC package 524 may take the form of any of the embodiments described above with reference to the IC package 520.

The IC device assembly 500 illustrated in FIG. 5 includes a package-on-package structure 534 coupled to the second face 542 of the circuit board 502 by coupling components 528. The package-on-package structure 534 may include an IC package 526 and an IC package 532 coupled together by coupling components 530 such that the IC package 526 is disposed between the circuit board 502 and the IC package 532. The coupling components 528 and 530 may take the form of any of the embodiments of the coupling components 516 discussed above, and the IC packages 526 and 532 may take the form of any of the embodiments of the IC package 520 described above. The package-on-package structure 534 may be configured in accordance with any of the package-on-package structures known in the art.

Note that the IC device assembly 500 of FIG. 5 may include fewer or additional packaging components and/or materials based on the desired packaging design.

Figure 6:
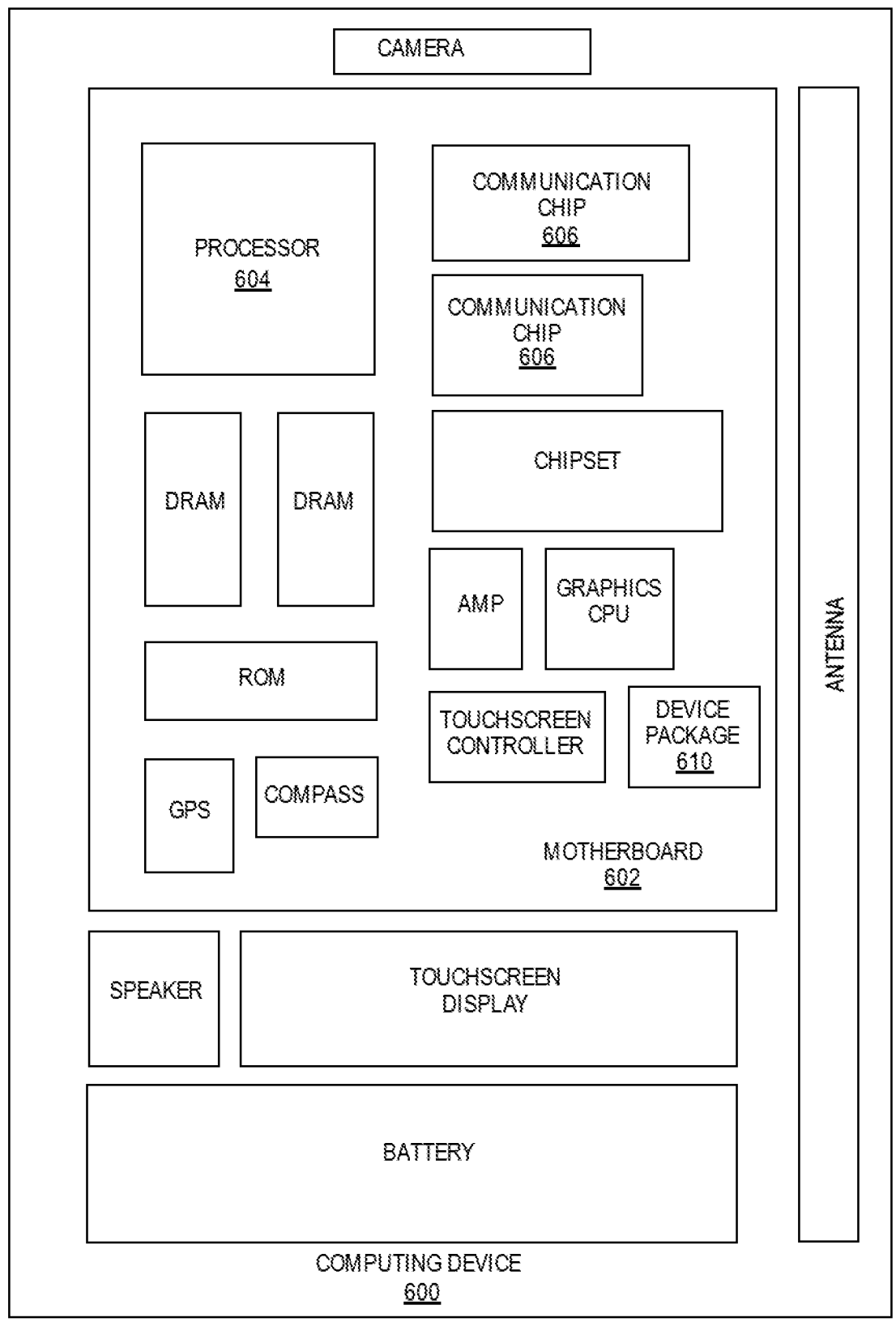
FIG. 6 is a schematic block diagram illustrating a computer system that utilizes a device package having one or more transistor devices with a plurality of stacked transistors that utilize a single workfunction gate metal, according to one embodiment.

FIG. 6 is a schematic block diagram illustrating a computer system 600 that utilizes a device package 610 having a transistor device with a plurality of stacked transistors that utilize a single workfunction gate metal, according to one embodiment. FIG. 6 illustrates an example of computing device 600. Computing device 600 houses motherboard 602. For one embodiment, motherboard 602 may be similar to the circuit board 502 of FIG. 5. Motherboard 602 may include a number of components, including but not limited to processor 604, device package 610 (or semiconductor package), and at least one communication chip 606. Processor 604 is physically and electrically coupled to motherboard 602. For some embodiments, at least one communication chip 606 is also physically and electrically coupled to motherboard 602. For other embodiments, at least one communication chip 606 is part of processor 604.

Depending on its applications, computing device 600 may include other components that may or may not be physically and electrically coupled to motherboard 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 606 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

Processor 604 of computing device 600 includes an integrated circuit die packaged within processor 604. Device package 610 may be, but is not limited to, a substrate, a package substrate, a CMOS package, a microelectronic device, and/or a PCB. Device package 610 may include one or more transistor devices with a plurality of stacked transistors that utilize a single workfunction gate metal—without requiring dual gate metals, a complex deposition/etch process, and degradation issues—as described herein (e.g., as illustrated in FIGS. 1 and 2A-2E). Device package 610 may also include any other components from the Figures described herein.

Note that device package 610 may be a single component/device, a subset of components, and/or an entire system, as the materials, features, and components may be limited to device package 610 and/or any other component of the computing device 600 that may need transistor devices with self-aligned stacked transistors utilizing a single workfunction gate metal (e.g., the motherboard 602, the processor 604, and/or any other component of the computing device 600).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 606 also includes an integrated circuit die packaged within the communication chip 606. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1

A transistor device, comprising: a first conductive layer over a substrate; a first transistor layer having a plurality of first interconnects in the first conductive layer; a second conductive layer on an insulating layer, wherein the insulating layer is on the first conductive layer; a second transistor layer having a plurality of second interconnects in the second conductive layer; and a gate electrode over the substrate, wherein the gate electrode has a workfunction metal, and wherein the workfunction metal of the gate electrode surrounds the plurality of first interconnects and the plurality of second interconnects.

Example 2

The transistor device of Example 1, wherein the workfunction metal of the gate electrode includes one or more workfunction metals, and wherein the one or more workfunction metals include chromium (Cr), molybdenum (Mo), tin (Sn), nickel-silicon (NiSi), titanium (TiSi), titanium/aluminum (Ti/Al) compounds, silicon/silicon-germanium (Si/SiGe), or indium-gallium-arsenide (InGaAs).

Example 3

The transistor device of Examples 1-2, wherein the first and second transistor layers include n-type conductivity materials or p-type conductive materials.

Example 4

The transistor device of Examples 1-3, further comprising: a first insulating layer on the substrate, wherein the first insulating layer is disposed between the first conductive layer and the substrate; a plurality of sidewall spacers over the first insulating layer and the substrate, wherein the plurality of sidewall spacers are vertically disposed on one or more sidewalls of the insulating layer, the first conductive layer, and the second conductive layer, and wherein the first insulating layer is disposed between the substrate and the plurality of sidewall spacers; and an isolation layer over the first insulating layer and the substrate, wherein the isolation layer vertically surrounds the plurality of sidewall spacers, the insulating layer, the first conductive layer, the second conductive layer, and the gate electrode.

Example 5

The transistor device of Examples 1-4, wherein the isolation layer is a dielectric.

Example 6

The transistor device of Examples 1-5, wherein the first and second conductive layers include one or more conductive materials, and wherein the one or more conductive materials include an epitaxial (EPI) layer, a metal layer, or a doped-semiconductor layer.

Example 7

The transistor device of Examples 1-6, further comprising: a first dielectric surrounding each of the first and second interconnects, wherein the first dielectric is surrounded by the workfunction metal of the gate electrode; a transition layer disposed between the first dielectric and each of the first and second interconnects; and a second dielectric disposed on the outer sidewalls of the workfunction metal of the gate electrode, wherein the second dielectric includes a surface that is parallel to a surface of the substrate.

Example 8

The transistor device of Examples 1-7, wherein the first and second dielectrics include a high-k dielectric material.

Example 9

The transistor device of Examples 1-8, wherein the first and second interconnects include one or more metal-oxide-semiconductor (MOS) interconnects, and wherein the one or more MOS interconnects include fin field-effect transistor (FinFET) interconnects, nanowire (NW) interconnects, or nanoribbon (NR) interconnects.

Example 10

The transistor device of Examples 1-9, wherein the first and second interconnects include square interconnects, rectangular interconnects, oval interconnects, circular interconnects, elongated interconnects, or hourglass-shaped interconnects.

Example 11

A method of forming a transistor device, comprising: disposing a first conductive layer over a substrate; disposing a first transistor layer having a plurality of first interconnects in the first conductive layer; disposing a second conductive layer on an insulating layer, wherein the insulating layer is on the first conductive layer; disposing a second transistor layer having a plurality of second interconnects in the second conductive layer; and disposing a gate electrode over the substrate, wherein the gate electrode has a workfunction metal, and wherein the workfunction metal of the gate electrode surrounds the plurality of first interconnects and the plurality of second interconnects.

Example 12

The method of Example 11, wherein the workfunction metal of the gate electrode includes one or more workfunction metals, and wherein the one or more workfunction metals include Cr, Mo, Sn, NiSi, TiSi, Ti/Al compounds, Si/SiGe, or InGaAs.

Example 13

The method of Examples 11-12, wherein the first and second transistor layers include n-type conductivity materials or p-type conductive materials.

Example 14

The method of Examples 11-13, further comprising: a first insulating layer on the substrate, wherein the first insulating layer is disposed between the first conductive layer and the substrate; a plurality of sidewall spacers over the first insulating layer and the substrate, wherein the plurality of sidewall spacers are vertically disposed on one or more sidewalls of the insulating layer, the first conductive layer, and the second conductive layer, and wherein the first insulating layer is disposed between the substrate and the plurality of sidewall spacers; and an isolation layer over the first insulating layer and the substrate, wherein the isolation layer vertically surrounds the plurality of sidewall spacers, the insulating layer, the first conductive layer, the second conductive layer, and the gate electrode.

Example 15

The method of Examples 11-14, wherein the isolation layer is a dielectric.

Example 16

The method of Examples 11-15, wherein the first and second conductive layers include one or more conductive materials, and wherein the one or more conductive materials include an EPI layer, a metal layer, or a doped-semiconductor layer.

Example 17

The method of Examples 11-16, further comprising: a first dielectric surrounding each of the first and second interconnects, wherein the first dielectric is surrounded by the workfunction metal of the gate electrode; a transition layer disposed between the first dielectric and each of the first and second interconnects; and a second dielectric disposed on the outer sidewalls of the workfunction metal of the gate electrode, wherein the second dielectric includes a surface that is parallel to a surface of the substrate.

Example 18

The method of Examples 11-17, wherein the first and second dielectrics include a high-k dielectric material.

Example 19

The method of Examples 11-18, wherein the first and second interconnects include one or more MOS interconnects, and wherein the one or more MOS interconnects include FinFET interconnects, NW interconnects, or NR interconnects.

Example 20

The method of Examples 11-19, wherein the first and second interconnects include square interconnects, rectangular interconnects, oval interconnects, circular interconnects, elongated interconnects, or hourglass-shaped interconnects.

Example 21

A memory device, comprising: a semiconductor substrate; and a transistor device above the semiconductor substrate; and a plurality of stacked transistors of the transistor device integrated over the semiconductor substrate, wherein a stacked transistor of the plurality of transistors includes a first conductive layer over the semiconductor substrate; a first transistor layer having a plurality of first interconnects in the first conductive layer a second conductive layer on an insulating layer, wherein the insulating layer is on the first conductive layer; a second transistor layer having a plurality of second interconnects in the second conductive layer; and a gate electrode over the semiconductor substrate, wherein the gate electrode has a workfunction metal, and wherein the workfunction metal of the gate electrode surrounds the plurality of first interconnects and the plurality of second interconnects.

Example 22

The memory device of Example 21, wherein the workfunction metal of the gate electrode of the stacked transistor includes one or more workfunction metals, wherein the one or more workfunction metals include Cr, Mo, Sn, NiSi, TiSi, Ti/Al compounds, Si/SiGe, or InGaAs, wherein the first and second transistor layers include n-type conductivity materials or p-type conductivity materials.

Example 23

The memory device of Examples 21-22, further comprising: a first insulating layer on the semiconductor substrate, wherein the first insulating layer is disposed between the first conductive layer and the semiconductor substrate; a plurality of sidewall spacers of the stacked transistor over the first insulating layer and the semiconductor substrate, wherein the plurality of sidewall spacers are vertically disposed on one or more sidewalls of the insulating layer, the first conductive layer, and the second conductive layer of the stacked transistor, and wherein the first insulating layer is disposed between the semiconductor substrate and the plurality of sidewall spacers; and an isolation layer over the first insulating layer and the semiconductor substrate, wherein the isolation layer vertically surrounds the plurality of sidewall spacers, the insulating layer, the first conductive layer, the second conductive layer, and the gate electrode of the stacked transistor, and wherein the isolation layer is a dielectric.

Example 24

The memory device of Examples 21-23, wherein the first and second conductive layers of the stacked transistor include one or more conductive materials, wherein the one or more conductive materials include an EPI layer, a metal layer, or a doped-semiconductor layer, wherein the first and second interconnects of the stacked transistor include one or more MOS interconnects, wherein the one or more MOS interconnects include FinFET interconnects, nanowire NW interconnects, or nanoribbon NR interconnects, and wherein the first and second interconnects of the stacked transistor include square interconnects, rectangular interconnects, oval interconnects, circular interconnects, elongated interconnects, or hourglass-shaped interconnects.

Example 25

The memory device of Examples 21-24, further comprising: a first dielectric of the stacked transistor surrounding each of the first and second interconnects of the stacked transistor, wherein the first dielectric of the stacked transistor is surrounded by the workfunction metal of the gate electrode of the stacked transistor; a transition layer of the stacked transistor disposed between the first dielectric and each of the first and second interconnects of the stacked transistor; and a second dielectric of the stacked transistor disposed on the outer sidewalls of the workfunction metal of the gate electrode of the stacked transistor, wherein the second dielectric of the stacked transistor includes a surface that is parallel to a surface of the semiconductor substrate, and wherein the first and second dielectrics of the stacked transistor include a high-k dielectric material In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

What is claimed is:

1. A transistor device, comprising:
   a first conductive layer over a substrate;
   a first transistor layer having a plurality of first interconnects in the first conductive layer;
   a second conductive layer on an insulating layer, wherein the insulating layer is on the first conductive layer;
   a second transistor layer having a plurality of second interconnects in the second conductive layer; and
   a gate electrode over the substrate, wherein the gate electrode has a workfunction metal, and wherein the workfunction metal of the gate electrode surrounds the plurality of first interconnects and the plurality of second interconnects.

2. The transistor device of claim 1, wherein the workfunction metal of the gate electrode includes chromium (Cr), molybdenum (Mo), tin (Sn), nickel-silicon (NiSi), titanium (TiSi), titanium/aluminum (Ti/Al) compounds, silicon/silicon-germanium (Si/SiGe), or indium-gallium-arsenide (InGaAs).

3. The transistor device of claim 1, wherein the first and second transistor layers include n-type conductivity materials or p-type conductivity materials.

4. The transistor device of claim 1, further comprising:
   a first insulating layer on the substrate, wherein the first insulating layer is disposed between the first conductive layer and the substrate;
   a plurality of sidewall spacers over the first insulating layer and the substrate, wherein the plurality of sidewall spacers are vertically disposed on one or more sidewalls of the insulating layer, the first conductive layer, and the second conductive layer, and wherein the first insulating layer is disposed between the substrate and the plurality of sidewall spacers; and
   an isolation layer over the first insulating layer and the substrate, wherein the isolation layer vertically surrounds the plurality of sidewall spacers, the insulating layer, the first conductive layer, the second conductive layer, and the gate electrode.

5. The transistor device of claim 4, wherein the isolation layer is a dielectric.

6. The transistor device of claim 1, wherein the first and second conductive layers include an epitaxial (EPI) layer, a metal layer, or a doped-semiconductor layer.

7. The transistor device of claim 1, further comprising:
   a first dielectric surrounding each of the first and second interconnects, wherein the first dielectric is surrounded by the workfunction metal of the gate electrode;
   a transition layer disposed between the first dielectric and each of the first and second interconnects; and
   a second dielectric disposed on the outer sidewalls of the workfunction metal of the gate electrode, wherein the second dielectric includes a surface that is parallel to a surface of the substrate.

8. The transistor device of claim 7, wherein the first and second dielectrics include a high-k dielectric material.

9. The transistor device of claim 1, wherein the first and second interconnects include fin field-effect transistor (FinFET) interconnects, nanowire (NW) interconnects, or nanoribbon (NR) interconnects.

10. The transistor device of claim 9, wherein the first and second interconnects include square interconnects, rectangular interconnects, oval interconnects, circular interconnects, elongated interconnects, or hourglass-shaped interconnects.

11. A method of forming a transistor device, comprising:
    disposing a first conductive layer over a substrate;
    disposing a first transistor layer having a plurality of first interconnects in the first conductive layer;
    disposing a second conductive layer on an insulating layer, wherein the insulating layer is on the first conductive layer;
    disposing a second transistor layer having a plurality of second interconnects in the second conductive layer; and
    disposing a gate electrode over the substrate, wherein the gate electrode has a workfunction metal, and wherein the workfunction metal of the gate electrode surrounds the plurality of first interconnects and the plurality of second interconnects.

12. The method of claim 11, wherein the workfunction metal of the gate electrode includes Cr, Mo, Sn, NiSi, TiSi, Ti/Al compounds, Si/SiGe, or InGaAs.

13. The method of claim 11, wherein the first and second transistor layers include n-type conductivity materials or p-type conductive materials.

14. The method of claim 11, further comprising:
    forming a first insulating layer on the substrate, wherein the first insulating layer is disposed between the first conductive layer and the substrate;
    forming a plurality of sidewall spacers over the first insulating layer and the substrate, wherein the plurality of sidewall spacers are vertically disposed on one or more sidewalls of the insulating layer, the first conductive layer, and the second conductive layer, and wherein the first insulating layer is disposed between the substrate and the plurality of sidewall spacers; and
    forming an isolation layer over the first insulating layer and the substrate, wherein the isolation layer vertically surrounds the plurality of sidewall spacers, the insulating layer, the first conductive layer, the second conductive layer, and the gate electrode.

15. The method of claim 14, wherein the isolation layer is a dielectric.

16. The method of claim 11, wherein the first and second conductive layers include an EPI layer, a metal layer, or a doped-semiconductor layer.

17. The method of claim 11, further comprising:
forming a first dielectric surrounding each of the first and second interconnects, wherein the first dielectric is surrounded by the workfunction metal of the gate electrode;
forming a transition layer disposed between the first dielectric and each of the first and second interconnects; and
forming a second dielectric disposed on the outer sidewalls of the workfunction metal of the gate electrode, wherein the second dielectric includes a surface that is parallel to a surface of the substrate.

18. The method of claim 17, wherein the first and second dielectrics include a high-k dielectric material.

19. The method of claim 11, wherein the first and second interconnects include FinFET interconnects, nanowire interconnects, or nanoribbon interconnects.

20. The method of claim 19, wherein the first and second interconnects include square interconnects, rectangular interconnects, oval interconnects, circular interconnects, elongated interconnects, or hourglass-shaped interconnects.

21. A memory device, comprising:
a semiconductor substrate; and
a transistor device above the semiconductor substrate; and
a plurality of stacked transistors of the transistor device integrated over the semiconductor substrate, wherein a stacked transistor of the plurality of transistors includes
a first conductive layer over the semiconductor substrate;
a first transistor layer having a plurality of first interconnects in the first conductive layer;
a second conductive layer on an insulating layer, wherein the insulating layer is on the first conductive layer;
a second transistor layer having a plurality of second interconnects in the second conductive layer; and
a gate electrode over the semiconductor substrate, wherein the gate electrode has a workfunction metal, and wherein the workfunction metal of the gate electrode surrounds the plurality of first interconnects and the plurality of second interconnects.

22. The memory device of claim 21, wherein the workfunction metal of the gate electrode of the stacked transistor includes Cr, Mo, Sn, NiSi, TiSi, Ti/Al compounds, Si/SiGe, or InGaAs, wherein the first and second transistor layers include n-type conductivity materials or p-type conductive materials.

23. The memory device of claim 21, further comprising:
a first insulating layer on the semiconductor substrate, wherein the first insulating layer is disposed between the first conductive layer and the semiconductor substrate;
a plurality of sidewall spacers of the stacked transistors over the first insulating layer and the semiconductor substrate, wherein the plurality of sidewall spacers are vertically disposed on one or more sidewalls of the insulating layer, the first conductive layer, and the second conductive layer of the stacked transistors, and wherein the first insulating layer is disposed between the semiconductor substrate and the plurality of sidewall spacers; and
an isolation layer over the first insulating layer and the semiconductor substrate, wherein the isolation layer vertically surrounds the plurality of sidewall spacers, the insulating layer, the first conductive layer, the second conductive layer, and the gate electrode of the stacked transistors, and wherein the isolation layer is a dielectric.

24. The memory device of claim 21, wherein the first and second conductive layers of the stacked transistors an EPI layer, a metal layer, or a doped-semiconductor layer, wherein the first and second interconnects of the stacked transistor include one or more MOS interconnects, wherein the FinFET interconnects, nanowire interconnects, or nanoribbon interconnects, and wherein the first and second interconnects of the stacked transistor include square interconnects, rectangular interconnects, oval interconnects, circular interconnects, elongated interconnects, or hourglass-shaped interconnects.

25. The memory device of claim 21, further comprising:
a first dielectric of the stacked transistors surrounding each of the first and second interconnects of the stacked transistors, wherein the first dielectric of the stacked transistors is surrounded by the workfunction metal of the gate electrode of the stacked transistors;
a transition layer of the stacked transistors disposed between the first dielectric and each of the first and second interconnects of the stacked transistors; and
a second dielectric of the stacked transistors disposed on the outer sidewalls of the workfunction metal of the gate electrode of the stacked transistors, wherein the second dielectric of the stacked transistors includes a surface that is parallel to a surface of the semiconductor substrate, and wherein the first and second dielectrics of the stacked transistors include a high-k dielectric material.

* * * * *